(12) United States Patent
Kang et al.

(10) Patent No.: US 12,041,748 B2
(45) Date of Patent: Jul. 16, 2024

(54) COOLING APPARATUS

(71) Applicant: LG Magna e-Powertrain Co., Ltd., Incheon (KR)

(72) Inventors: Myeon Gyu Kang, Seoul (KR); Yong Sik Kim, Seoul (KR); Namjoon Cho, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 745 days.

(21) Appl. No.: 17/259,071

(22) PCT Filed: Jul. 9, 2018

(86) PCT No.: PCT/KR2018/007764
§ 371 (c)(1),
(2) Date: Jan. 8, 2021

(87) PCT Pub. No.: WO2020/013349
PCT Pub. Date: Jan. 16, 2020

(65) Prior Publication Data
US 2021/0144879 A1    May 13, 2021

(51) Int. Cl.
*H05K 7/20* (2006.01)
*F28F 9/013* (2006.01)
*F28F 9/02* (2006.01)

(52) U.S. Cl.
CPC ............. *H05K 7/20* (2013.01); *F28F 9/0131* (2013.01); *F28F 9/0224* (2013.01)

(58) Field of Classification Search
CPC .............................. F28F 9/0131; F28F 9/0224
USPC .......................................... 165/173, 104.33
See application file for complete search history.

(56) References Cited

U.S. PATENT DOCUMENTS

| | | | |
|---|---|---|---|
| 7,571,759 B2 | 8/2009 | Inagaki et al. | |
| 8,061,412 B2* | 11/2011 | Ippoushi | H01L 23/473 165/185 |
| 9,941,187 B2* | 4/2018 | Yoshida | H01L 23/4012 |
| 2005/0051298 A1* | 3/2005 | Sakai | F28F 3/12 257/E23.098 |
| 2005/0121173 A1 | 6/2005 | Inagaki et al. | |

(Continued)

FOREIGN PATENT DOCUMENTS

| | | |
|---|---|---|
| JP | 2005191527 | 7/2005 |
| JP | 2006294921 | 10/2006 |

(Continued)

*Primary Examiner* — Joel M Attey
(74) *Attorney, Agent, or Firm* — Fish & Richardson P.C.

(57) ABSTRACT

A cooling apparatus includes: a plurality of cooling units each including a plurality of tube main bodies and a plurality of headers, each tube main body defining a cooling flow path that passes through an inside of the tube main body, and each header being disposed at both sides of the tube main body and vertically assembled based on the plurality of tube main bodies being stacked to thereby connect the cooling flow paths, a double-sided chip module disposed between at least two cooling units, and a heat-radiating adhesion portion attaching the double-sided chip module to the cooling unit. A set distance between the cooling unit and the double-sided chip module is maintained based on the plurality of headers being vertically assembled in contact with each other and equal to or less than a thickness of the heat-radiating adhesion portion.

20 Claims, 11 Drawing Sheets

(56) References Cited

U.S. PATENT DOCUMENTS

2013/0003301 A1    1/2013  Miyamoto et al.
2020/0166296 A1*   5/2020  Klusek .................. F28F 9/0226

FOREIGN PATENT DOCUMENTS

| JP | 2013115139 | 6/2013 |
| JP | 2016127774 | 7/2016 |
| JP | 2018057187 | 4/2018 |
| JP | 2018057188 | 4/2018 |

* cited by examiner

COOLING APPARATUS

CROSS-REFERENCE TO RELATED APPLICATIONS

This application is a National Stage application under 35 U.S.C. § 371 of International Application No. PCT/KR2018/007764, having an International Filing Date of Jul. 9, 2018. The disclosure of the prior application is considered part of the disclosure of this application, and is incorporated in its entirety into this application.

TECHNICAL FIELD

The present disclosure relates to a cooling apparatus for a double-sided chip module.

BACKGROUND ART

Interests in electric vehicles (EVs) and hybrid vehicles (HVs) are increasing to meet recently strengthened automotive carbon dioxide emission regulations.

However, when an electric vehicle is operated using other vehicle platforms, space constraints are a biggest problem.

In particular, as an inverter is mounted in a cramped engine room, the inverter needs to be as small as possible.

The size of the inverter is determined by the power module used.

Therefore, the power module needs to be designed to drive an electric drivetrain with efficient power supply and have a smallest size.

In this case, the size of the power module is determined based on power consumption of an internal power chip and cooling performance to maintain a chip temperature to be equal to or less than a set temperature.

A conventional power conversion device includes a flow path in a plate through which refrigerant flows in the cooling plate. Therefore, heat exchange is performed between the refrigerant flowing in the flow path in the plate and an electronic component, and the electronic component is cooled.

Another conventional power conversion device includes a communication cooling tube and a separation cooling tube. As the refrigerant flows through the separation cooling tube, an amount of refrigerant is increased to improve a cooling efficiency thereof.

However, for the conventional power conversion devices, there may be a problem in that the flow path along which the refrigerant flows is simply opened, and thus, the cooling performance may differ depending on local positions within the flow path.

SUMMARY

The present disclosure is directed to a cooling apparatus having a structure suitable for cooling a double-sided chip module in a miniaturized inverter and having improved cooling performance.

The present disclosure further provides a cooling apparatus including a double-sided chip module disposed between cooling units that are vertically stacked to effectively cool both surfaces of the double-sided chip module and maintaining contact to suppress an occurrence of an air gap.

According to one aspect of the subject matter described in this application, a cooling apparatus includes a plurality of cooling units each including a plurality of tube main bodies and a plurality of headers, each body of the plurality of tube main bodies defining a cooling flow path that passes through an inside of the tube main body for flowing a cooling water, and each header of the plurality of headers being (i) disposed at both sides of the tube main body and (ii) vertically assembled based on the plurality of tube main bodies being stacked to thereby connect the cooling flow paths defined in the plurality of tube main bodies, a double-sided chip module disposed between at least two cooling units of the plurality of cooling units and having an upper surface and a lower surface contacting the at least two cooling units, and a heat-radiating adhesion portion configured to attach the double-sided chip module to the cooling unit. A set distance between the cooling unit and the double-sided chip module can be (i) maintained based on the plurality of headers being vertically assembled in contact with each other and (ii) equal to or less than a thickness of the heat-radiating adhesion portion.

Implementations according to this aspect can include one or more of the following features. For example, each body of the plurality of tube main bodies can be extruded and can include a plurality of uniform cross-section cooling flow paths that are spaced apart from each other by a same distance and having a horizontal arrangement.

In some examples, a cross-section of each of the plurality of uniform cross-section cooling flow paths can have an area that is smaller than a cross-sectional area of each of side flow paths defined at both ends of the tube main body. In some examples, a cross-section of each of the plurality of uniform cross-section cooling flow paths can define an elongated slit hole that extends in a height direction of the tube main body.

In some implementations, at least two tube main bodies of the plurality of tube main bodies can be disposed vertically, a plurality of double-sided chip modules can be disposed between the at least two tube main bodies and can contact the at least two tube main bodies, and the plurality of double-sided chip modules can be spaced apart from each other by a predetermined distance along a longitudinal direction of the tube main body.

In some examples, at least one sealing material can be inserted between the plurality of headers assembled vertically. In some examples, the at least one sealing material can include an O-ring inserted between the plurality of headers, and the O-ring can have a filling rate of 60 to 90% and a compression rate of 8 to 30%.

In some implementations, the cooling apparatus can further include an end plate disposed on each header of the plurality of headers coupled to at least one of the plurality of tube main bodies that are vertically stacked and fixed by a fastening bolt that is configured to vertically pass through and fasten the plurality of headers. The fastening bolt can be configured to fix the end plate to the header and configured to fix the plurality of headers that are vertically assembled.

In some implementations, the cooling unit can include a first cooling unit including (i) a first tube main body defining a first cooling flow path and (ii) a first header coupled to both ends of the first tube main body, a second cooling unit stacked on the first tube main body and including (i) a second tube main body defining a second cooling flow path and (ii) a second header coupled to both ends of the second tube main body and assembled to the first header in contact with each other, and a third cooling unit stacked on the second tube main body and including (i) a third tube main body defining a third cooling flow path and (ii) a third header coupled to both ends of the third tube main body and assembled to the second header in contact with each other.

In some examples, the double-sided chip module can includes a plurality of first double-sided chip modules that are disposed between the first cooling unit and the second cooling unit, that have an upper surface and a lower surface contacting the first cooling unit and the second cooling unit, and that are spaced apart from each other in a horizontal direction, and a plurality of second double-sided chip modules that are disposed between the second cooling unit and the third cooling unit, that have an upper surface and a lower surface contacting the second cooling unit and the third cooling unit, that are disposed on a layer that is different from a layer including the first double-sided chip modules, and that are spaced apart from each other in a horizontal direction.

In some examples, each module of the first double-sided chip module and the second double-sided chip module can include three double-sided chip modules that are spaced apart from each other by a predetermined distance in the horizontal direction. In some implementations, the cooling apparatus can further include an end plate coupled to the first header. A first end of each of the first, second, and third headers can be configured to introduce the cooling water and a second end of each of the first, second, and third headers can be configured to discharge the cooling water.

In some examples, the end plate can be coupled to the first header by a fastening bolt, the fastening bolt can be configured to fasten and assemble the first header, the second header, and the third header, and at least one O-ring can be disposed at assembly portions among the first header, the second header, and the third header. In some implementations, the cooling apparatus can further include a first main body including a seating surface configured to seat at least two vertically stacked cooling units, and a second main body that is disposed opposite to the first main body, that contacts the at least two vertically stacked cooling units, and that is coupled to the first main body to compress the plurality of cooling units between the first main body and the second main body. A fastening position between the first main body and the second main body can be provided at a plurality of points that do not correspond to positions of a plurality of double-sided chip modules.

In some examples, the first main body can define protrusions into which fastening screws are inserted to be coupled to the second main body, and the protrusions can be provided at the plurality of points that do not correspond to the positions of the plurality of double-sided chip modules and protrude by a predetermined length toward both ends of the first main body in a width direction.

In some implementations, the header can include an insertion groove into which a first end of the tube main body is inserted to assemble the tube main body and the header. In some examples, a first contact portion between the insertion groove and the tube main body can be braze-joined. In some implementations, the cooling apparatus can further include an end plate disposed on each header of the plurality of headers. A second contact portion between the header and the end plate can braze-joined.

In some implementations, a distance between the plurality of uniform cross-section cooling flow paths and side flow paths defined at both ends of the tube main body can be different from the distance between the plurality of uniform cross-section cooling flow paths. In some implementations, the at least one O-ring can be configured to provide sealing between the first header, the second header, and the third header.

DETAILED DESCRIPTION

Figure 1:
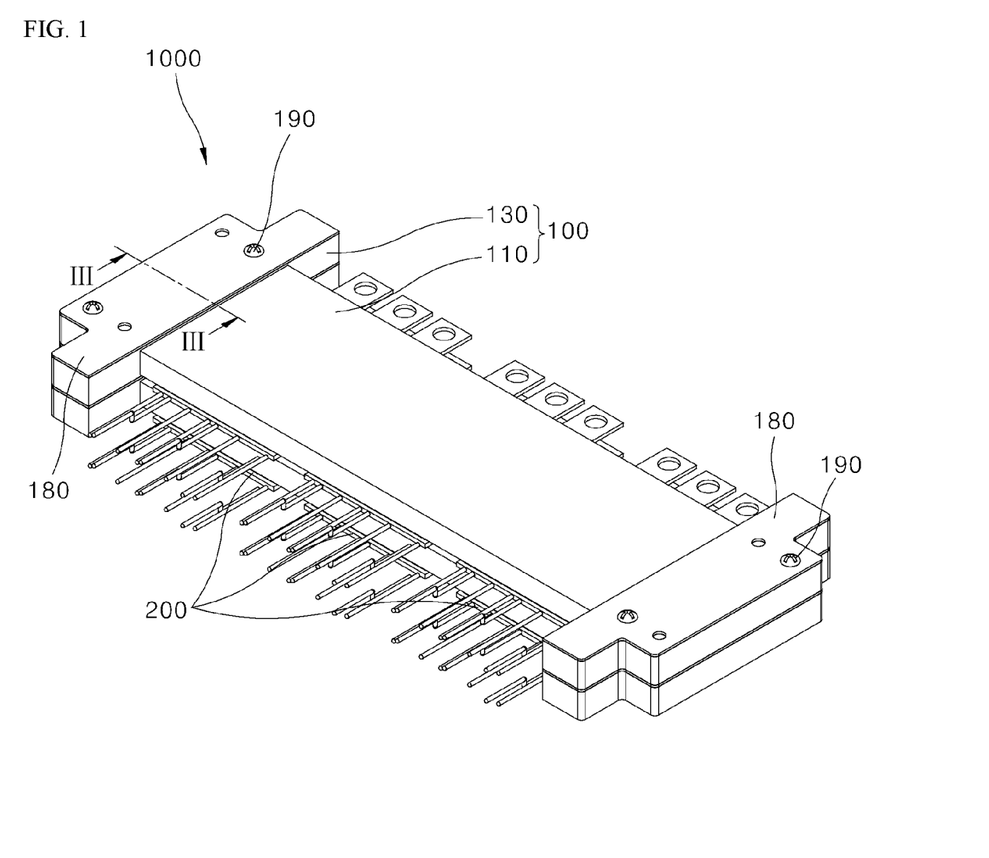
FIG. 1 is a diagram illustrating a perspective view of an exemplary cooling apparatus.
Figure 2:
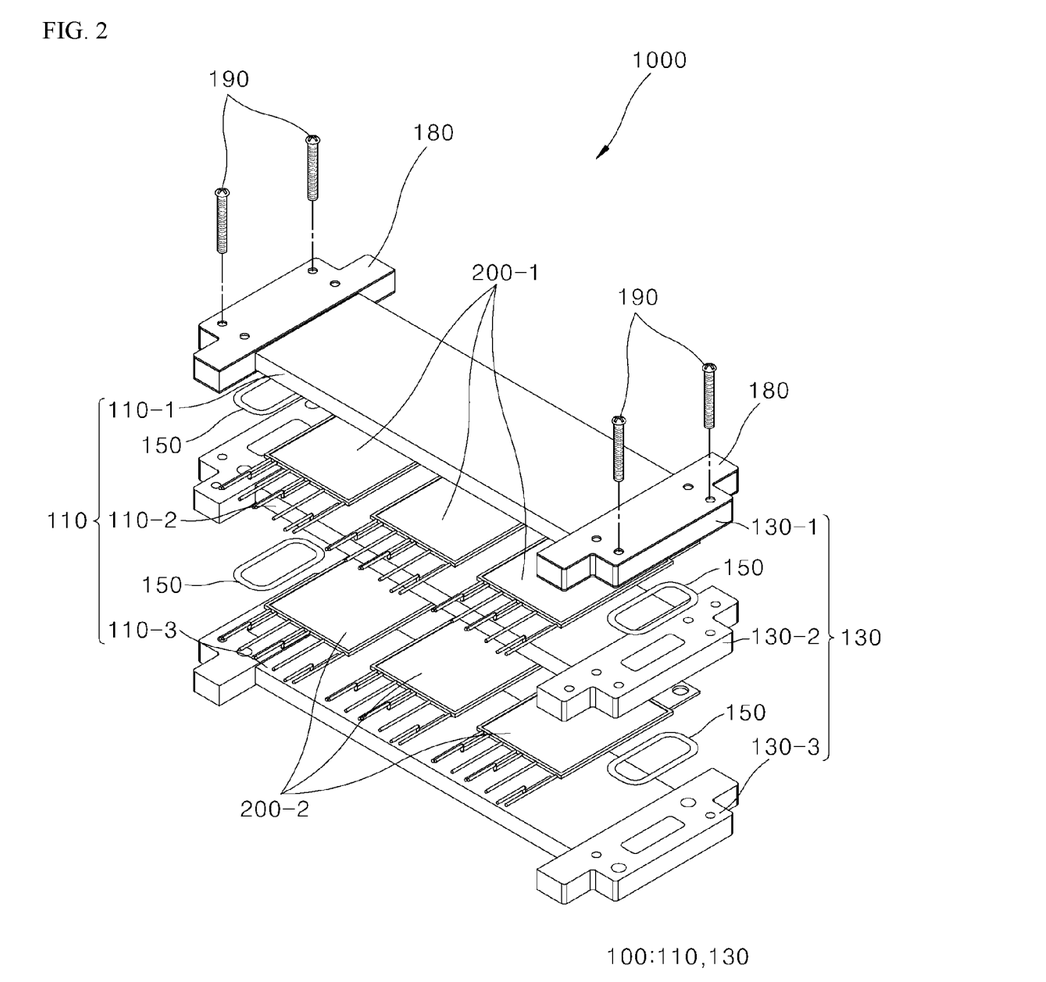
FIG. 2 is a diagram illustrating an exploded perspective view of an exemplary cooling apparatus.

FIGS. 1 and 2 are diagrams illustrating a perspective view and an exploded perspective view of an exemplary cooling apparatus.

Figure 7:
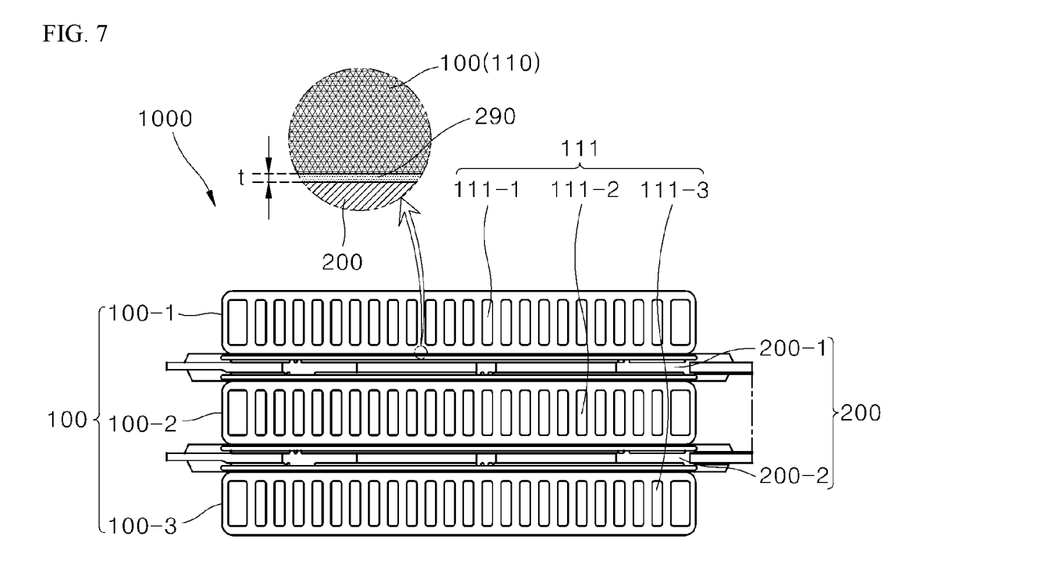
FIG. 7 is a diagram illustrating a horizontal cross-sectional view of an exemplary cooling apparatus defining cooling flow paths of a tube main body.

As shown, a cooling apparatus 1000 can include a cooling unit 100 that includes a tube main body 110 and a header 130, a double-sided chip module 200, and a heat-radiating adhesion portion 290 (see FIG. 7).

The tube main body 110 can be formed by extrusion, thereby having a high thermal conductivity and achieving excellent heat-radiating performance.

The tube main body 110 can include a plurality of cooling flow paths 111 (see FIG. 7) through which cooling water flows and passing through an inside of the tube main body 110. Specific cross-sectional shapes of the cooling flow paths 111 (see FIG. 7) are shown in FIG. 7.

The header 130 can be coupled to both ends of the tube main body 110.

When a plurality of tube main bodies 110 are stacked, the headers 130 coupled to the both ends of the tube main body 110 can be vertically assembled in contact with each other. For example, the plurality of tube main bodies 110 can be stably stacked vertically with set distances.

In some implementations, the header 130 connects the cooling flow paths 111 defined inside the tube main bodies 110.

A detailed description of the connecting structure between the tube main body 110 and the headers 130 will be described with respect to FIGS. 4 to 6.

A double-sided chip module 200 can be disposed between at least two cooling units 100 and can have both surfaces contacting the cooling units 100 to be cooled. Referring to FIGS. 1 and 2, three double-sided chip modules 200-1 and 200-2 can be respectively placed in two layers. The two layers can be vertically disposed among three cooling units 100 that are vertically stacked. This cooling apparatus 1000 can refer to "a double-type cooling apparatus."

A cooling apparatus including three double-sided chip modules 200 placed on a single layer disposed between two cooling units can also be used. Such cooling apparatus can refer to "a single-type cooling apparatus."

For example, the plurality of double-sided chip modules 200 disposed between at least two tube main bodies 110 at the same height are spaced apart from each other by predetermined distances along a longitudinal direction of the tube main body 110.

By way of further example, distances between the double-sided chip modules 200 can have a same size.

The double-sided chip modules 200 can be attached onto the cooling unit 100 using a heat-radiating adhesion portion 290.

The heat-radiating adhesion portion 290 can be a material to attach the double-sided chip modules 200 to the cooling unit 100 and can refer to "thermal interface material (TIM)."

As shown in FIG. 7, the heat-radiating adhesion portion 290 can be used to attach the double-sided chip modules 200 onto the cooling unit 100, for example, to the tube main body 110 and can have a predetermined thickness (t).

Referring to FIG. 7, when a plurality of headers 130 (see FIG. 2) are assembled vertically in contact with each other, a set distance (g) between the cooling unit 100 and the double-sided chip module 200 can be maintained. For example, the set distance (g) can be less than or equal to the thickness (t) (preferably, a minimum thickness) of the heat-radiating adhesion portion 290.

That is, when the gap between the double-sided chip module 200 and the tube main body 110 is measured, a target value of the measured gap can be preferably determined to be equal to or less than a minimum thickness of the TIM, which is the heat-radiating adhesion portion 290.

Therefore, generation of an air gap can be suppressed to maintain contact between the cooling unit 100 and the double-sided chip module 200, thereby improving cooling performance thereof.

In some implementations, at least one sealing material 150 can be disposed among the headers 130 assembled vertically in contact with each other.

For example, the sealing material 150 includes an O-ring inserted between the headers 130. The O-ring has a shape surrounding a periphery of a hole for introducing and discharging cooling water through the header 130 and maintains airtightness between the vertically assembled headers 130. For example, a filling rate of the O-ring can be 60 to 90% and a compression rate thereof can be 8 to 30%.

In some implementations, an end plate 180 can be further disposed on the header 130 coupled to at least one of the plurality of stacked tube main bodies 110 to block leakage of the cooling water.

The end plate 180 can be fixed by a fastening bolt 190 configured to simultaneously pass through and fasten the plurality of headers 130 that are vertically assembled in contact with each other.

The fastening bolt 190 can function to couple the end plates 180 to the tube main body 110 and contact the plurality of headers 130 using a fastening force.

Referring to FIG. 2, the cooling apparatus 1000 can include three cooling units (hereinafter, a first cooling unit 100-1, a second cooling unit 100-2, and a third cooling unit 100-3).

The first cooling unit 100-1 can include a first tube main body 110-1 formed by extrusion to define a first cooling flow path 111-1 (See FIG. 3), and a first header 130-1 coupled to both ends of the first tube main body 110-1.

The second cooling unit 100-2 can be stacked on the first tube main body 110-1. The second cooling unit 100-2 can include a second tube main body 110-2 formed by extrusion to define a second cooling flow path 111-2 (See FIG. 3), and a second header 130-2 coupled to both ends of the second tube main body 110-2 and assembled to the first header 130-1 in contact with each other.

The third cooling unit 100-3 can be stacked on the second tube main body 110-2. The third cooling unit 100-3 can include a third tube main body 110-3 formed by extrusion to define a third cooling flow path 111-3 and a third header 130-3 coupled to both ends of the third tube main body 110-3 and assembled to the second header 130-2 in contact with each other.

As described above, the first tube main body 110-1, the second tube main body 110-2, and the third tube main body 110-3 can be stacked vertically and coupled to each other and define the cooling water flow paths that are connected by the first header 130-1, the second header 130-2, and the third header 130-3.

In some implementations, a sealing material 150 such as an O-ring and the like can be disposed among the first header 130-1, the second header 130-2, and the third header 130-3 to block leakage and maintain airtightness when the cooling water flows.

In some implementations, the end plate 180 can be coupled to the first header 130-1. The end plate 180 can be fixed using at least two fastening bolts 190, and the fastening bolts 190 can simultaneously fasten and fix the first header 130-1, the second header 130-2, and the third header 130-3.

A third header 130-3 can be disposed opposite to the first header 130-1 to couple to the end plate 180.

The cooling water can be introduced into the cooling flow paths of the first tube main body 110-1, the second tube main body 110-2, and the third tube main body 110-3 through a first end of the three headers. Subsequently, the cooling water can be discharged through a second end of the three headers.

The double-sided chip module 200 can include a first double-sided chip module 200-1 and a second double-sided chip module 200-2.

Three first double-sided chip modules 200-1 can be disposed between the first cooling unit 100-1 and the second cooling unit 100-2 and can be spaced apart from each other in a horizontal direction.

Three second double-sided chip modules 200-2 can be disposed on a layer that is different from the layer to place the first double-sided chip modules 200-1 and can be spaced apart from each other in the horizontal direction.

The first double-sided chip module 200-1 and the second double-sided chip module 200-2 can be disposed among the first cooling unit, the second cooling unit 100-2, and the third cooling unit 100-3 and each have both surfaces contacting the cooling units to be cooled.

The fastening bolt 190 can couple the end plate 180 to the tube main body 110. As shown in FIG. 2, the fastening bolt 190 can sequentially pass through and couple the end plate 180, the first header 130-1, the second header 130-2, and the third header 130-3. In some implementations, at least one sealing material 150 such as the O-ring is inserted among the first header 130-1, the second header 130-2, and the third header 130-3.

Figure 3:
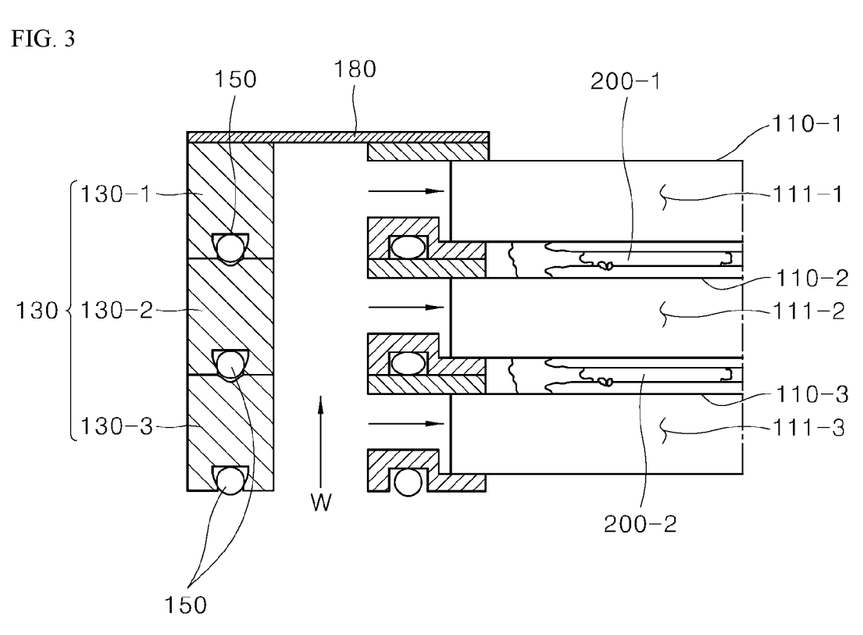
FIG. 3 is a diagram illustrating an enlarged cross-sectional view taken along line "III-III" in FIG. 1.

FIG. 3 is a diagram illustrating an enlarged cross-sectional view taken along line "III-III" in FIG. 1.

Referring to FIG. 3, a first tube main body 110-1, a second tube main body 110-2, and a third tube main body 110-3 can be stacked vertically, and a first cooling flow path 111-1, a second cooling flow path 111-2, and a third cooling flow path 111-3 can be connected to each other by a first header 130-1, a second header 130-2, and a third header 130-3.

The first header 130-1, the second header 130-2, and the third header 130-3 can be assembled vertically in contact with each other.

A sealing material 150 such as an O-ring can be inserted among the first header 130-1, the second header 130-2, and the third header 130-3 to prevent leakage of cooling water.

Further, the end plate 180 can be coupled to the first header 130-1.

In some implementations, the cooling water (W) is introduced through the third header 130-3 and flows along a first cooling flow path 111-1, a second cooling flow path 111-2, and a third cooling flow path 111-3.

Thus, the cooling water can effectively cool the first double-sided chip module 200-1 disposed between the first tube main body 110-1 and the second tube main body 110-2 and the second double-sided chip module 200-2 disposed between the second tube main body 110-2 and the third main body 110-3.

Figure 4:
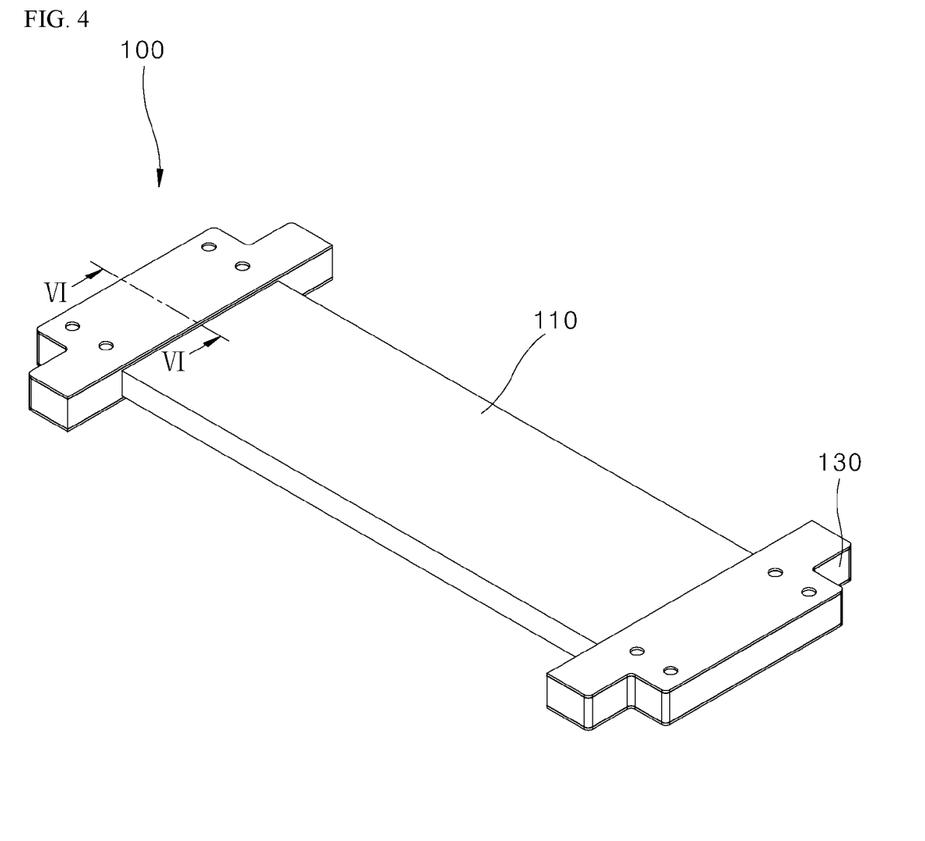
FIG. 4 is a diagram illustrating a perspective view of a cooling unit of an exemplary cooling apparatus.

FIG. 4 is a diagram illustrating a perspective view of a cooling unit of an exemplary cooling apparatus. FIG. 5 is a diagram illustrating an exploded perspective view of a cooling unit.

A cooling unit 100 can include a tube main body 110 and a header 130.

The tube main body 110 defines a cooling flow path 111 for flowing cooling water and passing through an inside of the tube main body 110. The tube main body 110 can be formed by extrusion, thereby having high thermal conductivity and achieving excellent heat-radiating performance.

The headers 130 can be coupled to both ends of the tube main body 110 and a plurality of headers 130 can be vertically assembled in contact with each other. The header 130 can communicate with the cooling flow path 111 to allow introduction and discharging of the cooling water.

Figure 5:
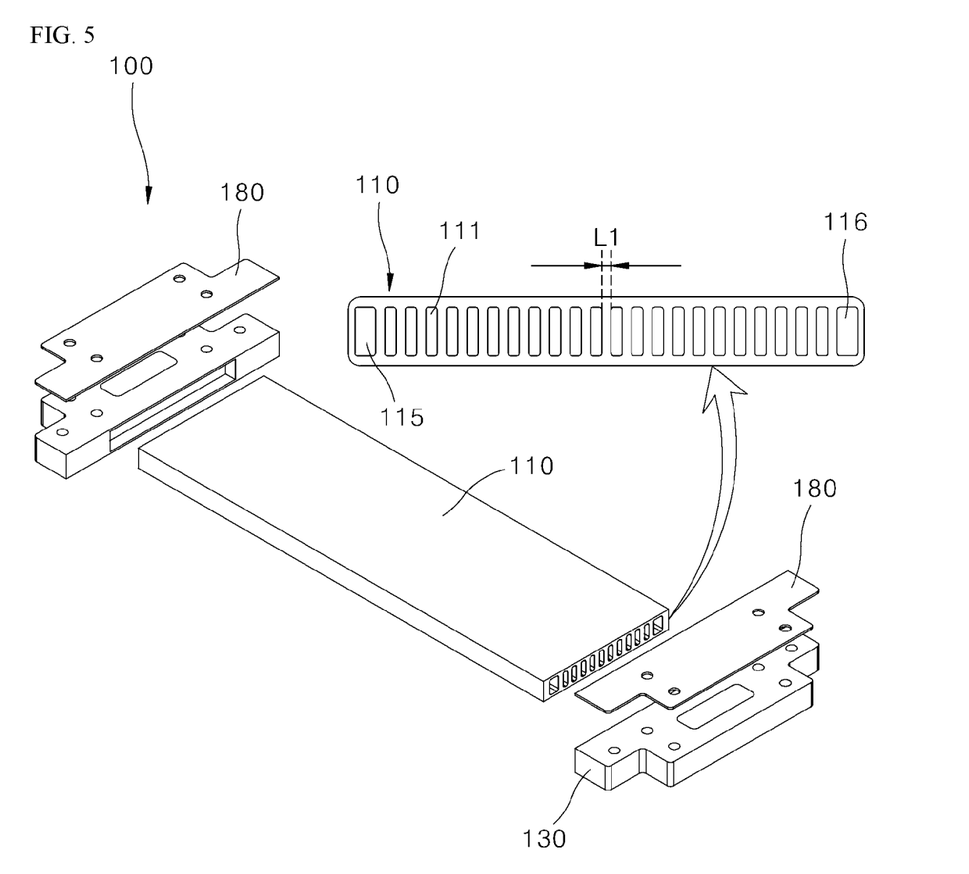
FIG. 5 is a diagram illustrating an exploded perspective view of an exemplary cooling unit.

The cooling unit 100 shown in FIGS. 4 and 5 can be a first cooling unit 100-1 among the three cooling units 100-1, 100-2, and 100-3 shown in FIG. 2. In some implementations, the end plate 180 can be coupled to the header 130.

Referring to FIG. 5, the tube main body 110 can include a plurality of cooling flow paths 111 passing through an inside of the tube main body 110.

For example, the tube main body 110 defines the plurality of uniform cross-section cooling flow paths 111 that are spaced apart from each other by a same distance (L1) and having a horizontal arrangement. In some implementations, the plurality of uniform cross-section cooling flow paths 111 may not be defined at side flow paths 115 and 116 defined at both ends of a cross-section.

In some implementations, each path of the plurality of uniform cross-section cooling flow paths 111 can have a cross-sectional area that is smaller than that of each of the side flow paths 115 and 116.

In some implementations, the cross-section of each path of the plurality of uniform cross-section cooling flow paths 111 includes an elongated slit hole (i.e., a straight-shaped elongated hole) extending in a height direction of the tube main body.

Figure 6:
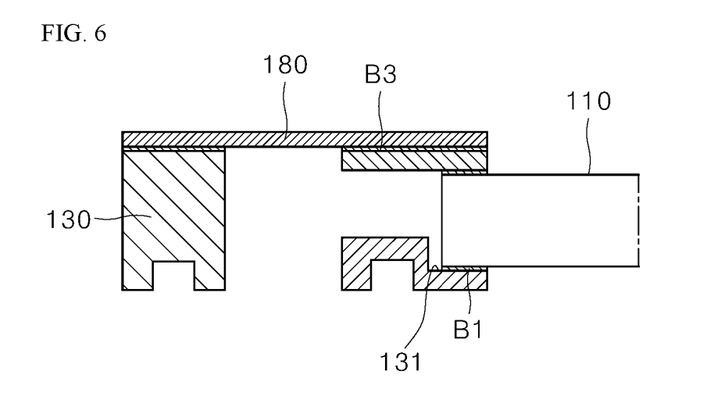
FIG. 6 is a diagram illustrating an enlarged cross-sectional view taken along line "VI-VI" in FIG. 4.

FIG. 6 is a diagram illustrating an enlarged cross-sectional view taken along line "VI-VI" in FIG. 4.

Referring to FIG. 6, one end of a tube main body 110 can be inserted into an insertion groove 131 of a header 130 to assemble the tube main body 110 and the header 130. In some implementations, an end plate 180 can be coupled to the header 130. In some implementations, a contact portion (B1) between the insertion groove 131 of the header 130 and the tube main body 110 is braze-joined. In some implementations, a contact portion (B3) between the header 130 and the end plate 180 is braze-joined.

Figure 8:
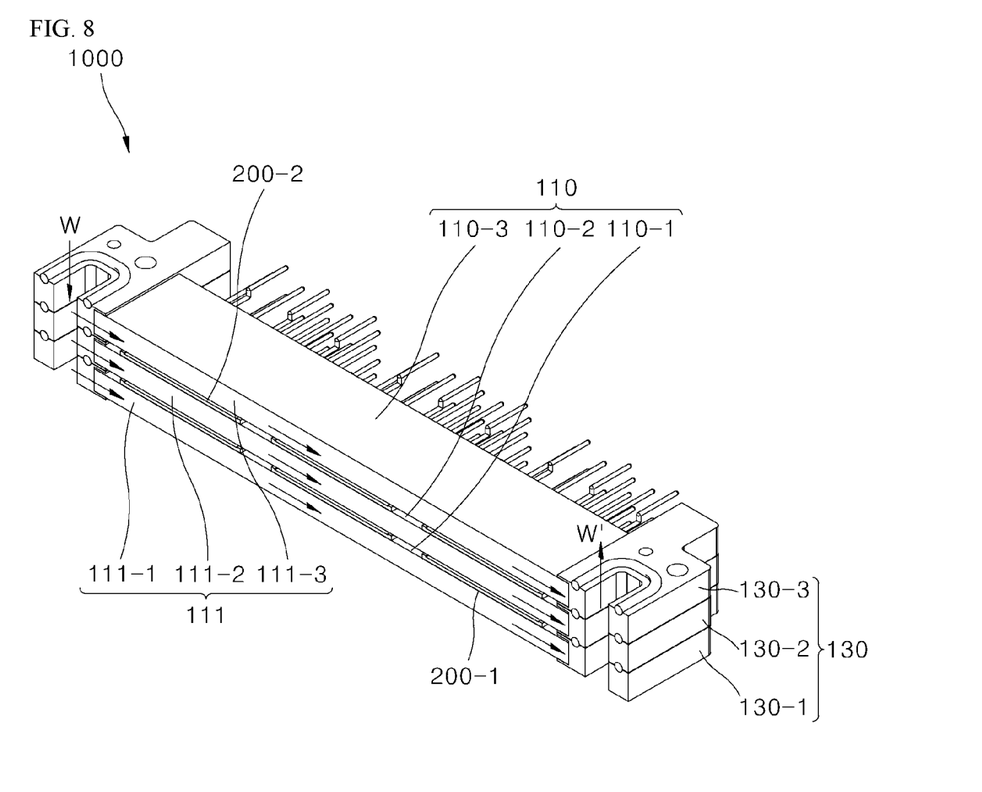
FIG. 8 is a diagram illustrating a longitudinal cross-sectional view of an exemplary cooling apparatus defining a flow of cooling water.

FIG. 7 is a diagram illustrating a horizontal cross-sectional view of an exemplary cooling apparatus defining cooling flow paths of tube main bodies. FIG. 8 is a diagram illustrating a vertical cross-sectional view of an exemplary cooling apparatus defining flow of cooling water.

As shown, a first cooling unit 100-1, a second cooling unit 100-2, and a third cooling unit 100-3 can be stacked vertically. In some implementations, a first cooling flow path 111-1, a second cooling flow path 111-2, and a third cooling flow path 111-3 are connected to each other by a first header 130-1, a second header 130-2, and a third header 130-3.

The first double-sided chip module 200-1 and the second double-sided chip module 200-2 can be disposed among the first cooling unit 100-1, the second cooling unit 100-2, and the third cooling unit 100-3 and each of the modules have an upper surface and a lower surface contacting the cooling units to be cooled by the cooling water flowing through the first cooling flow path 111-1, the second cooling flow path 111-2, and the third cooling flow path 111-3.

The first double-sided chip module 200-1 and the second double-sided chip module 200-2 can be attached onto the tube main body 110 using a heat-radiating adhesion portion 290 and the heat-radiating adhesion portion 290 can have a predetermined thickness (t).

The first header 130-1, the second header 130-2, and the third header 130-3 can be assembled vertically in contact with each other, thereby maintaining a set distance (g) between the cooling unit 100 and the double-sided chip module 200.

In some implementations, the set distance (g) can be less than or equal to the thickness (t) (preferably, a minimum thickness) of the heat-radiating adhesion portion 290. For example, the set distance between the double-sided chip module 200 and the tube main body 110 can be selected to be equal to or less than a minimum thickness of the TIM, which is the heat-radiating adhesion portion 290.

In some implementations, as shown in FIG. 8, the cooling water (W) is supplied through a first end of three headers 130-1, 130-2, and 130-3, flows through a first cooling flow path 111-1, a second cooling flow path 111-2, and a third cooling flow path 111-3 to cool the first double-sided chip module 200-1 and the second double-sided chip module 200-2. Subsequently, cooling water (W') that has been used for cooling is discharged through a second end of the three headers.

Hereinafter, a description of the first main body and the second main body coupled to each other in an exemplary cooling apparatus.

Figure 9:
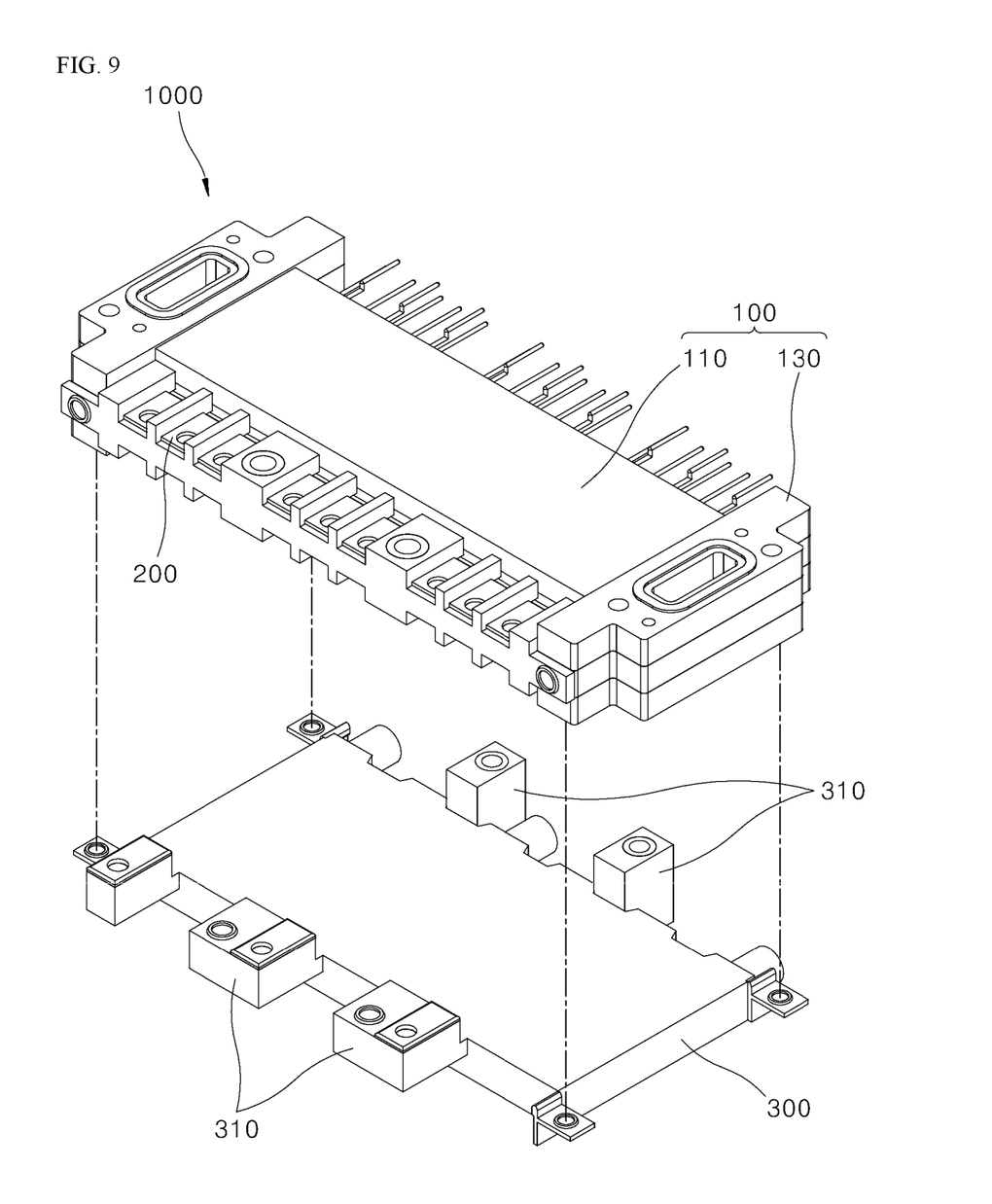
FIGS. 9 and 10 are diagrams illustrating an exploded perspective view of a first main body and a second main body to be coupled to each other in an exemplary cooling apparatus.
Figure 10:
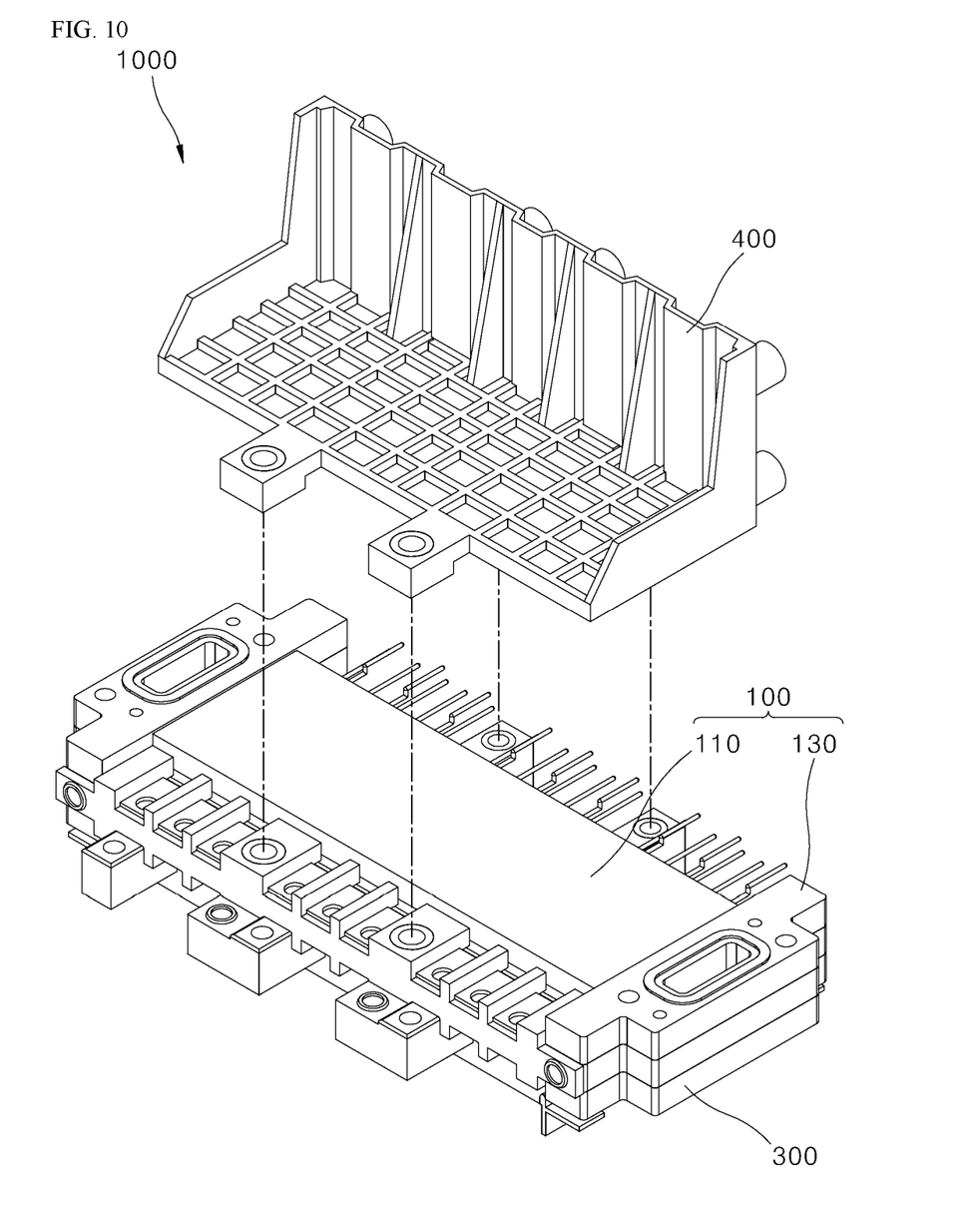
Figure 11:
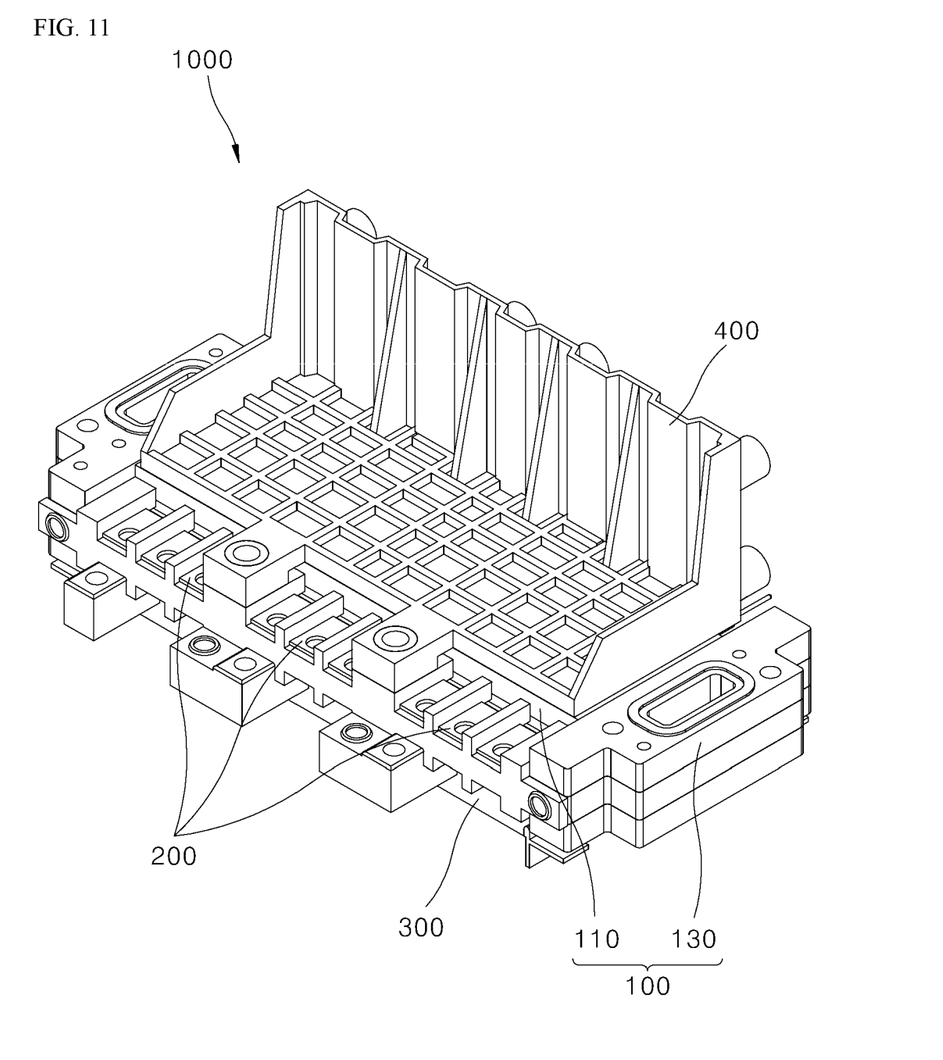
FIG. 11 is a diagram illustrating a perspective view of a first main body and a second main body coupled to each other in an exemplary cooling apparatus.

FIGS. 9 and 10 are diagrams illustrating exploded perspective views of a first main body and a second main body to be coupled to each other in an exemplary cooling apparatus. FIG. 11 is a diagram illustrating a perspective view of a first main body and a second main body coupled to each other.

Referring to FIGS. 9 and 10, a cooling apparatus 1000 can further include a first main body 300 and a second main body 400.

The first main body 300 can provide a seating surface configured to seat a plurality of stacked cooling units 100. For example, in the case of a double-type cooling apparatus 1000, three cooling units 100 can be stacked, and each cooling unit 100 can include a tube main body 110 and a header 130.

The second main body 400 can be disposed opposite to the first main body 300 and can be coupled to the first main body 300 in contact with the plurality of stacked cooling units 100. For example, the plurality of stacked cooling units 100 and the double-sided chip modules 200 disposed among the cooling units can be compressed in a vertical direction (i.e., a height direction) between the first main body 300 and the second main body 400.

In some implementations, the first main body 300 and the second main body 400 can be screw-coupled using a fastening screw and the like. For example, a fastening position between the first main body 300 and the second main body 400, that is, a fastening position of the fastening screw may not correspond to the position of the plurality of double-sided chip modules 200. By way of further example, a plurality of fastening screws can be fastened, and in this case, the fastening screws can be fastened at a plurality of points not corresponding to the positions of the plurality of double-sided chip modules 200.

For example, the first main body 300 can be coupled to the second main body 400 and can include protrusions 310 (see FIG. 9). The protrusions 310 (see FIG. 9) are portions into which fastening screws can be inserted to couple the first main body 300 to the second main body 400. In some implementations, the protrusions 310 (see FIG. 9) may not be provided at positions corresponding to the positions of the plurality of double-sided chip modules 200, but can extend toward both ends of the first main body 300 in a width direction thereof and protrude by a predetermined length.

Accordingly, when the first main body 300 and the second main body 400 are coupled to each other, damage to the double-sided chip modules 200 disposed between the plurality of stacked cooling units 100 can be limited.

As described above, according to the configurations and operations of the present disclosure, the cooling apparatus can have the structure suitable for cooling the double-sided chip modules in the miniaturized inverter to improve cooling performance thereof.

Furthermore, the cooling unit can be manufactured by extrusion, thereby having the high thermal conductivity and achieving the excellent heat-radiating performance.

Moreover, the double-sided chip modules can be disposed among the cooling units to effectively cool the both surfaces thereof. For example, the contact between the cooling units and each of the double-sided chip modules can be maintained, thereby preventing the generation of the air gap between them.

The invention claimed is:
1. A cooling apparatus, comprising:
a first cooling unit comprising (i) a first tube main body that defines a first cooling flow path configured to carry a cooling water and (ii) a pair of first headers coupled to both ends of the first tube main body, respectively;
a second cooling unit comprising (i) a second tube main body that is stacked on the first tube main body and defines a second cooling flow path configured to carry the cooling water and (ii) a pair of second headers stacked on the pair of first headers and coupled to both ends of the second tube main body, respectively, wherein the second cooling flow path is connected to the first cooling flow path via the pair of second headers and the pair of first headers;
a double-sided chip module disposed between the first tube main body and the second tube main body, the double-sided chip module having (i) a first surface facing the first tube main body and (ii) a second surface facing the second tube main body;
a first heat-radiating adhesion portion configured to attach the first surface of the double-sided chip module to the first tube main body;
a second heat-radiating adhesion portion configured to attach the second surface to the second tube main body;
a pair of end plates disposed on the pair of second headers, respectively;
a pair of first fastening members that pass through the pair of end plates and the pair of second headers and are fastened to the pair of first headers, respectively, the pair of first fastening members being configured to press the pair of end plates and the pair of first headers toward the pair of second headers, respectively;
a first main body that supports the first cooling unit;
a second main body disposed on the second tube main body; and
a second fastening member that passes through the second main body and is fastened to the first main body, the second fastening member being configured to press the first main body and the second main body toward the first and second cooling units,
wherein the second fastening member is disposed between the pair of first fastening members, and
wherein the first and second heat-radiating adhesion portions are compressed between the first tube main body and the second tube main body.

2. The cooling apparatus of claim 1, wherein each of the first and second tube main bodies is extruded and comprises a plurality of uniform cross-section cooling flow paths that are spaced apart from each other by a same distance and having a horizontal arrangement.

3. The cooling apparatus of claim 2, wherein a cross-section of each of the plurality of uniform cross-section cooling flow paths has an area that is smaller than a cross-sectional area of each of side flow paths defined at the both ends of the first tube main body.

4. The cooling apparatus of claim 2, wherein a cross-section of each of the plurality of uniform cross-section cooling flow paths defines an elongated slit hole that extends in a height direction of the first tube main body.

5. The cooling apparatus of claim 1,
wherein the double-sided chip module is one of a plurality of double-sided chip modules, and
wherein the plurality of double-sided chip modules are spaced apart from each other by a predetermined distance along a longitudinal direction of the first tube main body.

6. The cooling apparatus of claim 5, wherein at least one sealing material is inserted between the first and second headers.

7. The cooling apparatus of claim 6, wherein the at least one sealing material comprises an O-ring inserted between the first and second headers, and
wherein the O-ring has a filling rate of 60 to 90% and a compression rate of 8 to 30%.

8. The cooling apparatus of claim 1,
wherein the pair of first fastening members comprise a fastening bolt configured to fix the pair of end plate to the first and second headers.

9. The cooling apparatus of claim 1, further comprising:
a third cooling unit disposed between the first and second cooling units, the third cooling unit comprising (i) a third tube main body that defines a third cooling flow path configured to carry the cooling water and (ii) a pair of third headers coupled to both ends of the third tube main body, wherein the third tube main body are disposed between the first and second tube main bodies, wherein the pair of third headers are disposed between the pair of first headers and the pair of second headers, and wherein the third cooling flow path is connected with the first and second cooling flow paths via the pair of third headers, the pair of second headers, and the pair of first headers.

10. The cooling apparatus of claim 9, wherein the double-sided chip module comprises:
 a plurality of first double-sided chip modules that are disposed between the first and second cooling units, that are attached to the first and second cooling units, and that are spaced apart from each other in a horizontal direction; and
 a plurality of second double-sided chip modules that are disposed between the second and third cooling units, that are attached to the second and third cooling units and that are spaced apart from each other in the horizontal direction.

11. The cooling apparatus of claim 10, wherein each of the first double-sided chip modules and the second double-sided chip modules comprise three double-sided chip modules that are spaced apart from each other by a predetermined distance in the horizontal direction.

12. The cooling apparatus of claim 9,
 wherein one of the pair of first headers is configured to receive the cooling water, and the other one of the pair of first header is configured to discharge the cooling water.

13. The cooling apparatus of claim 12,
 wherein at least one O-ring is disposed at assembly portions among the first header, the second header, and the third header.

14. The cooling apparatus of claim 1,
 wherein the second fastening member is spaced apart from the double-sided chip module.

15. The cooling apparatus of claim 14, wherein the second fastening member is one of second fastening members,
 wherein the first main body defines protrusions into which the second fastening members are inserted to be coupled to the second main body, and
 wherein the protrusions are spaced apart from the double-sided chip module and protrude by a predetermined length toward both ends of the first main body in a width direction.

16. The cooling apparatus of claim 1, wherein the first header comprises an insertion groove into which a first end of the first tube main body is inserted to assemble the first tube main body and the first header.

17. The cooling apparatus of claim 16, wherein a first contact portion between the insertion groove and the first tube main body is braze-joined.

18. The cooling apparatus of claim 17,
 wherein a second contact portion between the second header and the end plate is braze-joined.

19. The cooling apparatus of claim 2, wherein a distance between the plurality of uniform cross-section cooling flow paths and side flow paths defined at the both ends of the first tube main body is different from the distance between the plurality of uniform cross-section cooling flow paths.

20. The cooling apparatus of claim 13, wherein the at least one O-ring is configured to provide sealing between the first header, the second header, and the third header.

* * * * *

UNITED STATES PATENT AND TRADEMARK OFFICE
CERTIFICATE OF CORRECTION

| | | |
|---|---|---|
| PATENT NO. | : 12,041,748 B2 | Page 1 of 1 |
| APPLICATION NO. | : 17/259071 | |
| DATED | : July 16, 2024 | |
| INVENTOR(S) | : Kang et al. | |

It is certified that error appears in the above-identified patent and that said Letters Patent is hereby corrected as shown below:

On the Title Page

Item (73) Assignee, Please change "LG Electronics Inc." to --LG Magna e-Powertrain Co., Ltd., Incheon (KR)--.

Signed and Sealed this
First Day of October, 2024

Katherine Kelly Vidal
*Director of the United States Patent and Trademark Office*